(12) United States Patent
Sun et al.

(10) Patent No.: US 8,067,067 B2
(45) Date of Patent: Nov. 29, 2011

(54) CLEAN, DENSE YTTRIUM OXIDE COATING PROTECTING SEMICONDUCTOR PROCESSING APPARATUS

(75) Inventors: Jennifer Y. Sun, Sunnyvale, CA (US); Senh Thach, Union City, CA (US); Jim Dempster, Sunnyvale, CA (US); Li Xu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1170 days.

(21) Appl. No.: 10/898,113

(22) Filed: Jul. 22, 2004

(65) Prior Publication Data

US 2005/0037193 A1    Feb. 17, 2005

Related U.S. Application Data

(63) Continuation-in-part of application No. 10/075,967, filed on Feb. 14, 2002, now Pat. No. 6,776,873.

(51) Int. Cl.
*C23C 16/00* (2006.01)
*C23C 4/00* (2006.01)
*C23C 4/10* (2006.01)
*C23C 4/06* (2006.01)
*C23C 4/04* (2006.01)
*C23C 4/08* (2006.01)
*C23C 16/08* (2006.01)
*C23F 1/00* (2006.01)
*H01L 21/306* (2006.01)
*B05D 1/08* (2006.01)
*B05D 1/02* (2006.01)
*B05D 1/32* (2006.01)
*B05D 1/36* (2006.01)
*H05H 1/26* (2006.01)
*H05H 1/52* (2006.01)

(52) U.S. Cl. ........ 427/453; 118/715; 118/724; 118/725; 427/248.1; 427/255.7; 427/446; 427/447; 427/448; 427/449; 427/450; 427/451; 427/452; 427/454; 427/455; 427/456; 427/255.29; 427/255.39; 156/345.52

(58) Field of Classification Search ................ 118/715; 219/543; 427/314, 255.29, 255.39, 446–456
See application file for complete search history.

(56) References Cited

U.S. PATENT DOCUMENTS

| | | | |
|---|---|---|---|
| 5,069,938 A * | 12/1991 | Lorimer et al. ........ | 427/255.26 |
| 5,102,496 A * | 4/1992 | Savas .................... | 216/69 |
| 5,162,133 A * | 11/1992 | Bartha et al. .......... | 427/577 |
| 5,366,585 A | 11/1994 | Robertson et al. ..... | 156/643 |
| 5,407,121 A * | 4/1995 | Koopman et al. ...... | 228/206 |
| 5,413,877 A * | 5/1995 | Griffith ................ | 428/698 |
| 5,488,925 A | 2/1996 | Kumada ............... | 118/715 |
| 5,605,637 A | 2/1997 | Shan et al. ............ | 216/71 |
| 5,680,013 A | 10/1997 | Dornfest et al. ....... | 315/111.21 |
| 5,798,016 A | 8/1998 | Oehrlein et al. ....... | 156/345.37 |
| 6,027,629 A | 2/2000 | Hisamoto et al. ..... | 205/50 |
| 6,123,791 A | 9/2000 | Han et al. ............. | 156/1 |
| 6,143,432 A * | 11/2000 | de Rochemont et al. | 428/689 |
| 6,153,270 A * | 11/2000 | Russmann et al. ..... | 427/522 |
| 6,170,429 B1 | 1/2001 | Schoepp et al. ...... | 118/723 R |
| 6,352,611 B1 | 3/2002 | Han et al. ............. | 156/345 |
| 6,408,786 B1 | 6/2002 | Kennedy et al. ..... | 118/723 AN |
| 6,521,046 B2 | 2/2003 | Tanaka et al. ........ | 118/715 |
| 6,547,978 B2 | 4/2003 | Ye et al. .............. | 216/75 |
| 6,565,984 B1 | 5/2003 | Wu et al. ............. | 428/472.2 |
| 6,592,707 B2 | 7/2003 | Shih et al. ........... | 156/345.1 |
| 6,783,863 B2 * | 8/2004 | Harada et al. ........ | 428/469 |
| 2001/0003271 A1 | 6/2001 | Otsuki et al. ........ | 118/723.001 |
| 2002/0015853 A1* | 2/2002 | Wataya et al. ....... | 428/469 |
| 2002/0110698 A1 | 8/2002 | Singh .................. | 428/472 |
| 2002/0142611 A1* | 10/2002 | O'Donnell et al. ... | 438/710 |
| 2002/0177001 A1* | 11/2002 | Harada et al. ........ | 428/469 |
| 2003/0029563 A1* | 2/2003 | Kaushal et al. ....... | 156/345.1 |
| 2003/0051811 A1* | 3/2003 | Uchimaru et al. .... | 156/345.1 |
| 2003/0134134 A1* | 7/2003 | Simpson et al. ...... | 428/469 |
| 2004/0002221 A1* | 1/2004 | O'Donnell et al. ... | 438/710 |
| 2004/0067392 A1* | 4/2004 | Yamada et al. ....... | 428/702 |
| 2004/0229078 A1* | 11/2004 | Maeda ................. | 428/650 |
| 2005/0003240 A1* | 1/2005 | O'Donnell ........... | 428/698 |

FOREIGN PATENT DOCUMENTS

| | | |
|---|---|---|
| DE | 19955134 | 5/2001 |
| EP | 0293198 | 11/1988 |
| JP | 03-287797 | 12/1991 |
| JP | 2001023908 | 1/2001 |

* cited by examiner

*Primary Examiner* — Parviz Hassanzadeh
*Assistant Examiner* — Rakesh Dhingra
(74) *Attorney, Agent, or Firm* — Shirley L. Church, Esq.

(57) ABSTRACT

Disclosed herein is a method for applying plasma-resistant coatings for use in semiconductor processing apparatus. The coatings are applied over a substrate which typically comprises an aluminum alloy of the 2000 series or the 5000 through 7000 series. The coating typically comprises an oxide or a fluoride of Y, Sc, La, Ce, Eu, Dy, or the like, or yttrium-aluminum-garnet (YAG). The coating may further comprise about 20 volume % or less of $Al_2O_3$. The coatings are typically applied to a surface of an aluminum alloy substrate or an anodized aluminum alloy substrate using a technique selected from the group consisting of thermal/flame spraying, plasma spraying, sputtering, and chemical vapor deposition (CVD). To provide the desired corrosion resistance, it is necessary to place the coating in compression. This is accomplished by controlling deposition conditions during application of the coating.

9 Claims, 9 Drawing Sheets

CLEAN, DENSE YTTRIUM OXIDE COATING PROTECTING SEMICONDUCTOR PROCESSING APPARATUS

The present application is a continuation-in-part application of U.S. application Ser. No. 10/075,967, filed Feb. 14, 2002, now U.S. Pat. No. 6,776,873.

BACKGROUND OF THE INVENTION

1. Field of the Invention

The present invention relates to equipment and apparatus used in the manufacture of electronic devices including semiconductor devices, MEM devices, and other devices used in data manipulation, storage, and display, for example and not by way of limitation. In particular, the invention pertains to the use of yttrium oxide-comprising protective layers which are applied to a surface of apparatus, such as process chamber liners, gas feed plates, substrate support pedestals, and electrostatic chucks, valves, and similar components which are likely to be exposed to a corrosive environment. The presence of the protective layer protects an underlying material, which makes up a portion of the body, from the corrosive environment.

2. Description of the Background Art

Corrosion (including erosion) resistance is a critical property for components used in processing chambers where corrosive environments are present. This is especially true where high-energy plasma is present and electrical driving force may be combined with chemical driving force to act upon the surface of components present in the environment.

Process chambers and component apparatus present within processing chambers which are used in the fabrication of electronic devices and MEMS are frequently constructed from aluminum and aluminum alloys. Surfaces of a process chamber and component apparatus present within the chamber are frequently anodized to provide a degree of protection from the corrosive environment. However, the integrity of the anodization layer may be deteriorated by impurities in the aluminum or aluminum alloy, so that corrosion begins to occur early, shortening the life span of the protective coating. Ceramic materials of various compositions have been used in place of the aluminum oxide layer mentioned above, and have been used over the surface of the anodized layer to improve the protection of the underlying aluminum-based materials. However, the protective layer continues to be deteriorated by impurities in the aluminum or aluminum alloy, even though the life span of the protective layer is extended. More recently, high purity aluminum alloy materials have been developed which reduce the tendency of the protective layer or layers to fail. However, the high purity aluminum alloy materials tend to be expensive.

Yttrium oxide is a ceramic material which has shown considerable promise in the protection of aluminum and aluminum alloy surfaces which are exposed to fluorine-containing plasmas of the kind used in the fabrication of semiconductor devices. In U.S. application Ser. No. 10/075,967, the parent application of the present continuation-in part application, it is disclosed that a yttrium oxide coating applied over an anodized surface of a high purity aluminum alloy process chamber surface or process component surface produces excellent corrosion protection. In addition, the evaluation of pure ceramic materials used as apparatus components has illustrated that a long lifetime for the component may be achieved. However, there remains a need for a protective layer or coating which can protect the more standard high temperature aluminum-based materials, such as those in the 2000 series and the 5000 through 7000 series.

Japanese Patent Application No. HEI 3[1991]-287797, of Shinji Inazawa et al., published Dec. 18, 1991, discloses a corrosion-resistant ceramic film useful in protecting electric wires or component materials fabricated from aluminum or aluminum alloy from corrosive vapors or low melting point metals and highly corrosive inorganic halides and organic metal compounds. The corrosion-resistant ceramic film is formed by first producing an oxidized film formed by the anodic oxidation of the surface of aluminum or an aluminum alloy. Subsequently, the oxidized film is submersed in a solution to provide impregnation with at least one type of ion selected from the group consisting of chromium ions, yttrium ions, zirconium ions, and magnesium ions. The corrosion-resistant protective film surrounding an electric wire is produced by firing in an oxygen gas stream at 500° C. The particular example illustrating the concept is a coating on pure aluminum wire, where the ions in the anodized film are created using chromium trioxide aqueous solution.

In a further embodiment of the above-described technology, the corrosion-resistant material described above is further submersed in a solution of a ceramic precursor consisting of a polymerizable organic metal compound, followed by heat treatment to form an outer insulation film of oxide ceramic.

In U.S. Pat. No. 5,366,585, to Robertson et al., issued Nov. 3, 1994, a plasma processing chamber is described which includes a ceramic barrier material, preferably in the range of 130 μm to 250 μm thick, for protecting metallic walls of the process chamber from attack by the plasma. The ceramic material is said to typically comprise aluminum oxide, although the oxide and fluoride forms of aluminum, magnesium, and tantalum are mentioned. Although free-standing liners are described, protective ceramic layers which are deposited without consuming the underlying metal (aluminum) substrate are also described. For example, flame-sprayed or plasma-sprayed aluminum oxide is discussed.

U.S. Pat. No. 5,798,016, to Oehrlein et al., issued Aug. 25, 1998, describes a method and apparatus for etching semiconductor devices where undesirable deposition of films on internal surfaces of the apparatus are prevented using a heatable liner or process chamber wall. The heated liner or chamber wall may be constructed from a "wide variety of materials, for example, ceramics, aluminum, steel, and/or quartz. Aluminum is the preferred material because it is easy to machine." However, since aluminum is reactive with a number of plasmas, it is recommended that "aluminum oxide or a coating thereof be disposed on the liner or chamber walls", because aluminum oxide tends to be chemically inert. In addition to the materials used to construct the liner and/or chamber walls, a protective coating may be applied to the surfaces of the liner and/or chamber walls. Examples which are given include $Al_2O_3$, $Sc_2O_3$, or $Y_2O_3$.

U.S. Patent Application Publication No. US 2001/0003271A1, of Otsuki, published Jun. 14, 2001, describes a processing apparatus for semiconductor wafers, where the process may include a plasma, in which a film of $Al_2O_3$, or $Al_2O_3$ and $Y_2O_3$, is formed on an inner wall surface of the chamber and on those exposed surfaces of the members within the chamber which require a high corrosion resistance and insulating property. An example is given of a processing chamber where a base material of the chamber may be a ceramic material ($Al_2O_3$, $SiO_2$, AlN, etc.), aluminum, or stainless steel, metal or metal alloy, which has a sprayed film over the base material. The sprayed film may contain an oxide of Y, Sc, La, Ce, Eu, Dy, or the like, or fluoride of one of these metals. The film may be made of a compound of a III-a element of the periodic table, such as $Y_2O_3$ The film may substantially comprise $Al_2O_3$ and $Y_2O_3$. A sprayed film of yttrium-aluminum-garnet (YAG) is also mentioned. The sprayed film thickness is said to range from 50 μm to 300 μm. There is no description of the manner in which the sprayed film is applied. There is no description of the condition of the interface between the base material and the film. Further, there is no description of metal impurity concentrations in the sprayed film or loose particles which may be present on the film surface. This is important because the condition of the interface between the base material and the sprayed film will have a significant effect on the lifetime of the process chamber. The metal impurity content of the sprayed film and the loose particles present on the film surface will have a significant effect on the product yield for product produced in the process chamber, as will be addressed by applicants during the description of their invention.

U.S. Pat. No. 6,352,611, to Han et al., issued Mar. 5, 2002, describes a dielectric window of a reactor chamber where substrates are processed in a plasma of a processing gas. A ceramic composition of matter used to produce a process kit and a dielectric window preferably contains a ceramic compound (e.g., $Al_2O_3$) and an oxide of a Group IIIB metal (e.g., $Y_2O_3$). The ceramic compound may be selected from silicon carbide, silicon nitride, boron carbide, boron nitride, aluminum nitride, aluminum oxide, and mixtures thereof; however, aluminum oxide is said to be available in a pure form which does not outgas. The Group IIIB metal may be selected from the group consisting of scandium, yttrium, the cerium subgroup, and the yttrium subgroup; however, yttrium is preferred, with the oxide being yttrium oxide. The preferred process for forming or producing the dielectric member is by thermal processing of a powdered raw mixture comprising the ceramic compound, the oxide of a Group IIIB metal, a suitable additive agent, and a suitable binder agent.

U.S. Pat. No. 6,565,984, to Wu et al., issued May 20, 2003, describes the use of a high purity aluminum alloy to form process chambers and processing components used for plasma processing. The high purity aluminum alloy is protected by an anodization layer. By controlling the composition of the alloy and the size of particulate inclusions in the alloy, an improved performance is achieved with respect to corrosion resistance for the alloy protected by an anodization layer.

The above-described references are only a few of the background references available. However, in view of the existing art known to applicants, there is still a need for a protective layer or coating which can protect the more standard high temperature aluminum-based materials, such as those in the 2000 series or 5000 through 7000 series, where the alloy composition and size of particulate inclusions can cause problems of the kind described in the Wu et al. reference. The problems exist with respect to a protective aluminum oxide coating, whether formed by anodization or by spray application. Problems similar to those occurring in the aluminum oxide coatings occur when other protective spray coatings, such as sprayed films containing oxides of Y, Sc, La, Ce, Eu, Dy, or the like, or fluorides of one of these metals, such as $Y_2O_3$ or yttrium-aluminum-garnet (YAG), are applied over a surface of the 2000 series or 5000 through 7000 series of aluminum alloys. These aluminum alloys are very desirable as substrates for process chamber and component fabrication due to availability and cost, as well as performance properties not related to plasma corrosion resistance, so ability to apply a protective layer with an extended lifetime over these alloys is important.

SUMMARY OF THE INVENTION

We have determined that it is possible to extend the lifetime of an aluminum alloy of the 2000 series or the 5000 through 7000 Series, where the aluminum alloy is protected by a plasma-resistant coating containing an oxide of Y, Sc, La, Ce, Eu, Dy, or the like, or a fluoride of one of these metals, or yttrium-aluminum-garnet (YAG). An aluminum alloy coated with the coating of the invention applied by the method of the invention shows excellent plasma corrosion-resistance over a lifetime which is extended at least two times, and as much as four times, over the lifetime of a $Y_2O_3$ coated aluminum alloy of the kind previously known in the art.

To provide the extended lifetime corrosion resistance described, it is necessary to place the coating in compression. This is accomplished by controlling deposition conditions during application of the coating. Placing the coating under adequate compression helps prevent mobile impurities in the aluminum alloy substrate from migrating from the substrate into the coating and causing defects in the coating which enable penetration of the coating by reactive species which are in contact with the exterior surface of the coating. Placing the coating under compression also increases the density of the coating. The increased density of the coating provides better protection from corrosive plasmas and improves the machinability of a substrate protected by the sprayed film. Porosity is an indicator of the density of the coating, i.e., the less porous the coating, the more dense the coating. Porosity is expressed as the percentage of open space in the total volume of the coating. Yttrium oxide coatings which have been applied according to the present method have a porosity of about 1.4%. Typically, yttrium oxide coatings are applied according to the present method under conditions which result in a yttrium oxide film having a compressive stress which is sufficient to provide a yttrium oxide film porosity of about 1.5% or less. In comparison, yttrium oxide coatings which were deposited using prior art methods typically have porosities within the range of about 3% to about 5%.

To place the applied coating/film in compression, it is necessary to heat, at least to a nominal depth, the upper surface of the aluminum alloy substrate during application of the coating/film, so that upon cooling of the interfacial surface between the substrate and the coating, the coating is placed in compression by the contracting aluminum alloy. The upper surface of the aluminum alloy should be preheated to a depth of at least 250 mils (0.25 inch), and to a temperature of at least about 150-200° C. (Typically, the entire substrate to which the coating is to be applied is preheated.) When the upper surface of the aluminum alloy substrate to which the coating is applied is at a temperature of less than about 150-200° C., the coating will not be placed under adequate compression upon cooling to provide the desired corrosion resistance, and will not be sufficiently useful in acting to prevent particulates in the aluminum alloy substrate from migrating into the coating.

The film/coating may be applied using a number of different methods, such as thermal/flame spray, plasma discharge spray, sputtering, and chemical vapor deposition (CVD). The structure of the coating obtained is different in each instance. When the coating is applied using sputtering or CVD, the application rate is much slower, and it may be advantageous to use the coating in combination with an underlying layer of aluminum oxide. Plasma spray coating has provided excellent results. The protective coating may contain an oxide of Y, Sc, La, Ce, Eu, Dy, or the like, or a fluoride of one of these metals, or yttrium-aluminum-garnet (YAG). Combinations of the oxides of such metals, and/or combinations of the metal oxides with aluminum oxide, may be used. For example, $Y_2O_3$ in combination with a minority percentage of $Al_2O_3$ (typically, less than about 20% by volume) may be used to improve thermal expansion compatibility of the coating with the underlying aluminum alloy substrate. This is important when the component of structure is exposed to the thermal cycling which often occurs with chemical processing apparatus (such as semiconductor processing apparatus).

The plasma sprayed coating may be applied over a bare aluminum alloy surface. Typically, the aluminum alloy has a very thin film of native aluminum oxide on its surface, due to exposure of the aluminum surface to air. It is advantageous to apply the plasma sprayed coating over the bare aluminum alloy surface, or the surface exhibiting only a native oxide, as a better bond between the protective coating comprising an oxide or fluoride of Y, Sc, La, Ce, Eu, Dy, or the like, or YAG is achieved. The plasma sprayed coating may also be applied over an aluminum oxide film which is intentionally created upon the aluminum alloy surface. Typically, the thickness of such an oxide coating is less than about 4 mils.

When the coated component is to be used in a plasma processing chamber where it will be exposed to chlorine species, the plasma sprayed coating should be applied over such an intentionally created aluminum oxide film in order to better protect the underlying aluminum alloy from the corrosive chlorine plasma. In this instance, the thickness of the aluminum oxide film is typically within the range of about 0.5 mil to about 4 mils, and the temperature of the aluminum oxide film must be at least about 150-200° C. at the time of application of the protective coating comprising an oxide or fluoride of Y, Sc, La, Ce, Eu, Dy, or the like, or YAG. The temperature of the aluminum oxide film at the time of application of the protective coating should not exceed the glass transition temperature of the aluminum oxide.

Typically, the aluminum alloy surface is pre-roughened prior to anodization. The aluminum alloy surface can be pre-roughened using a technique such as bead blasting or, preferably electrochemical etching, for example, and not by way of limitation.

The applied thickness of the protective coating comprising an oxide or fluoride of Y, Sc, La, Ce, Eu, Dy, or the like, or YAG depends on the environment to which the aluminum alloy component or structure will be exposed during use. When the temperature to which the component or structure is exposed is lower, the thickness of the plasma sprayed coating can be increased without causing a coefficient of expansion problem. For example, when the component or structure may be exposed to thermal cycling between about 15° C. and about 120° C., and the protective coating is yttria (which has been plasma sprayed over an aluminum alloy from the 5000 through 7000 series having a native oxide present on its surface), the thickness of the yttria coating should range between about 12 mils and about 20 mils. A yttria coating having a thickness of about 15 mils provides excellent results. A thinner coating down to about 10 mils thickness may be used in combination with an anodized aluminum oxide coating, or other aluminum oxide coating having a thickness in the 0.5 mil to 4 mils range.

Application of the protective, plasma-resistant coating by plasma spraying has produced excellent results. When plasma spraying is used, to further improve the performance of the protective, plasma-resistant coating, it is advantageous to clean the coating after application to the substrate. The cleaning process removes trace metal impurities which may cause problems during semiconductor processing, and also removes loose particles from the surface of the coating which are likely to become contaminating particulates during the processing of product adjacent to the coated surface, especially when that product is a semiconductor device.

The cleaning process should remove undesired contaminants and deposition process by-products without affecting the performance capability of the protective coating, and without harming the underlying aluminum alloy surface. To protect the aluminum alloy surface while the coating is cleaned, the coating is first saturated with an inert solvent which does not harm the aluminum alloy upon contact. Typically, the coated substrate is immersed in a deionized water ultrasonic bath at a frequency of about 40 kHz (for example, and not by way of limitation) for a period of about 5 minutes to about 30 minutes. Subsequently, a chemically active solvent is applied to remove contaminants from the protective coating. For example, the surface of the coated substrate may be wiped with a soft wipe which has been wetted with a dilute acid solution for a period of about 3 minutes to about 15 minutes. One advantageous dilute acid solution comprises about 0.1 to about 5 volume % HF (more typically, about 1 to about 5 volume %); about 1 to about 15 volume % $HNO_3$ (more typically, about 5 to about 15 volume %); and about 80 to about 99 volume % deionized water. After wiping, the component is then rinsed with deionized water, followed by immersion in a deionized water ultrasonic bath at a frequency of about 40 kHz (for example, and not by way of limitation) for a period of about 30 minutes to about 2 hours (typically, for a period of about 40 minutes to about 1 hour).

In addition to removing impurities and contaminants from the coating surface, the step of wiping the coated component with the dilute HF solution provides fluorination to the coating surface. Fluorination of the coating surface results in a robust, stable coating which is inert to reactive plasmas. Fluorination of the coating surface can also be obtained by exposing the coated surface to a plasma containing fluorine species, such as a $CF_4$ plasma having a density of about $1=10^9\ e^-/cm^3$, under conditions which provide a coating surface which is at least partially fluorinated.

We have also discovered that application of a protective coating comprising an oxide or fluoride of Y, Sc, La, Ce, Eu, Dy, or the like, or YAG, which is under compression in accordance with the present invention, permits the drilling of patterns such as attachment openings through the protective coating and underlying aluminum alloy substrate, with less harm to both the protective coating and the interface between the protective coating and the underlying substrate. Laser drilling may be used to form round through-holes. Ultrasonic drilling provides excellent results when drilling throughholes of more complicated shapes (such as crescent shapes). The ultrasonic drilling can be carried out either from the coating surface side or the aluminum alloy substrate side of the component or substrate. The coated substrate may be cleaned after ultrasonic drilling according to the multiple step cleaning process described above.

When ultrasonic drilling a surface of a component or substrate, the best results are achieved when a thin sacrificial layer of a flexible, polymeric material is applied or when a more rigid material having a similar thermal coefficient of linear expansion to that of the protective coating is applied over the protective coating surface. The sacrificial layer is typically applied to have a thickness within the range of about 4 mils to about 6 mils.

BRIEF DESCRIPTION OF THE DRAWINGS

FIGS. 4A-4C show the cross-section of the spray-coated substrate at magnifications of 100×, 200×, and 250×, respectively. FIG. 4D shows the interface between the $Y_2O_3$ coating 404 and the underlying aluminum 402 in detail (2000× magnification).

FIGS. 6A and 6B show cross-sectional views of the hole 600 at magnifications of 35× and 150×. FIGS. 6C and 6D show cross-sectional views of the left side 606 and right side 608 of hole 600, at a magnification of 250×.

FIGS. 7A-7C show schematic illustrations (700, 710, 720, 730, 740, 750, 760) of various photomicrograph top views of the hole 600 shown in FIGS. 6A-6D, at magnifications of 25× (FIG. 7A), 50× (FIGS. 7B(1 & 2)), and 150× (FIGS. 7C(1-4)).

FIGS. 8A and 8B show cross-sectional views of the hole 700 at magnifications of 35 × and 150×. FIGS. 8C and 8D show cross-sectional views of the left side 806 and right side 808 of hole 800, at a magnification of 250×.

FIGS. 9A-9C show schematic illustrations (900, 910, 920, 930, 940, 950, 960) of various photomicrograph top views of the hole 800 shown in FIGS. 8A-8D, at magnifications of 25× (FIG. 9A), 50× (FIGS. 9B(1 & 2)), and 150× (FIGS. 9C(1-4)).

DETAILED DESCRIPTION OF EXEMPLARY EMBODIMENTS

Figure 1:
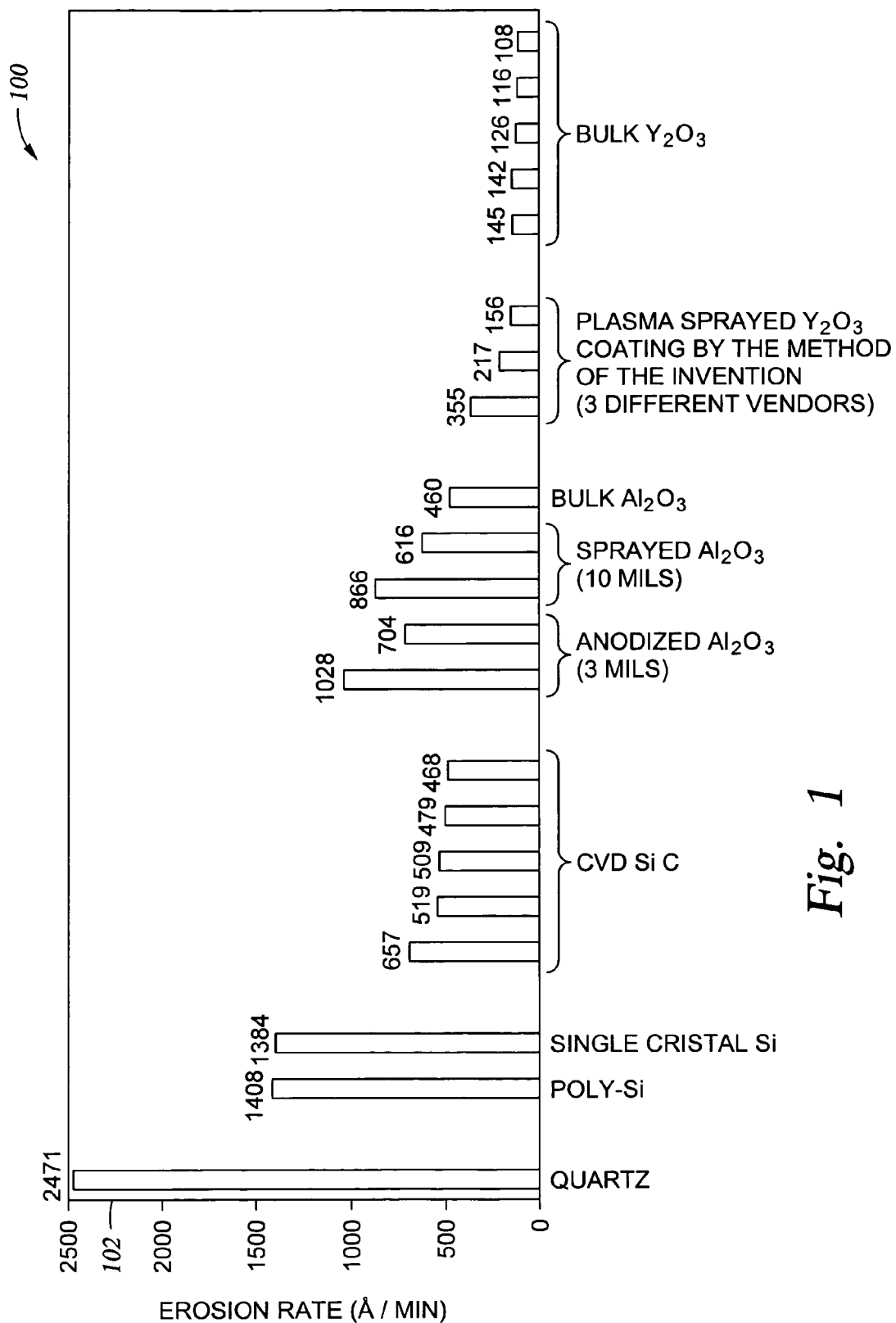
FIG. 1 is a graph 100 which illustrates the relative erosion rates 102 for various materials upon exposure of the materials to a $CHF_3/CF_4$ plasma

As a preface to the detailed description, it should be noted that, as used in this specification and the appended claims, the singular forms "a", "an", and "the" include plural referents, unless the context clearly dictates otherwise.

Disclosed herein is a method of applying a plasma-resistant coating on an aluminum or an aluminum alloy substrate. The present method is particularly useful for applying a plasma-resistant coating to a substrate which comprises an aluminum alloy of the 2000 series or the 5000 through 7000 Series. Because of its greater malleability, 2000 series aluminum is particularly preferred when fabricating parts and components having complex shapes.

The plasma-resistant coating comprises an oxide of Y, Sc, La, Ce, Eu, Dy, or the like, or a fluoride of one of these metals, or yttrium-aluminum-garnet (YAG). An aluminum alloy coated with the coating of the invention applied by the method of the invention shows excellent plasma corrosion-resistance over a lifetime which is extended at least two times, and as much as four times, over the lifetime of a $Y_2O_3$ coated aluminum alloy of the kind previously known in the art. Aluminum alloys which have been coated with the plasma-resistant coating applied by the method of the invention are particularly useful as interiors of semiconductor processing chambers and as substrates of component apparatus within such a processing chambers, such as process chamber liners, gas feed plates, substrate support pedestals, and electrostatic chucks, valves, and similar components which are likely to be exposed to a corrosive environment.

To provide the extended lifetime corrosion resistance described, it is necessary to place the coating in compression. This is accomplished by controlling deposition conditions during application of the coating. Placing the coating under adequate compression helps prevent mobile impurities in the aluminum alloy substrate from migrating from the substrate into the coating and causing defects in the coating which enable penetration of the coating by reactive species which are in contact with the exterior surface of the coating. Placing the coating under compression also increases the density of the coating. The increased density of the coating provides better protection from corrosive plasmas and improves the machinability of a substrate protected by the sprayed film. Porosity is an indicator of the density of the coating, i.e., the less porous the coating, the more dense the coating. Porosity is expressed as the percentage of open space in the total volume of the coating. Yttrium oxide coatings which have been applied according to the present method have a porosity of about 1.4%. Typically, yttrium oxide coatings are applied according to the present method under conditions which result in a yttrium oxide film having a compressive stress which is sufficient to provide a yttrium oxide film porosity of about 1.5% or less. In comparison, yttrium oxide coatings which were deposited using prior art methods typically have porosities within the range of about 3% to about 5%.

To place the applied coating/film in compression, it is necessary to heat, at least to a nominal depth, the upper surface of the aluminum alloy substrate during application of the coating/film, so that upon cooling of the interfacial surface between the substrate and the coating, the coating is placed in compression by the contracting aluminum alloy. The upper surface of the aluminum alloy should be preheated to a depth of at least 250 mils (0.25 inch), and to a temperature of at least about 150-200° C. (Typically, the entire substrate to which the coating is to be applied is preheated.) When the upper surface of the aluminum alloy substrate to which the coating is applied is at a temperature of less than about 150-200° C., the coating will not be placed under adequate compression upon cooling to provide the desired corrosion resistance, and will not be sufficiently useful in acting to prevent particulates in the aluminum alloy substrate from migrating into the coating.

The film/coating may be applied using a number of different methods, such as thermal/flame spray, plasma discharge spray, sputtering, and chemical vapor deposition (CVD). The structure of the coating obtained is different in each instance. When the coating is applied using sputtering or CVD, the application rate is much slower, and it may be advantageous to use the coating in combination with an underlying layer of aluminum oxide. Plasma spray coating has provided excellent results. The protective coating may contain an oxide of Y, Sc, La, Ce, Eu, Dy, or the like, or a fluoride of one of these metals, or yttrium-aluminum-garnet (YAG). Combinations of the oxides of such metals, and/or combinations of the metal oxides with aluminum oxide, may be used. For example, $Y_2O_3$ in combination with a minority percentage of $Al_2O_3$ (typically, less than about 20% by volume) may be used to improve thermal expansion compatibility of the coating with the underlying aluminum alloy substrate. This is important when the component of structure is exposed to the thermal cycling which often occurs with chemical processing apparatus (such as semiconductor processing apparatus).

The plasma sprayed coating may be applied over a bare aluminum alloy surface. Typically, the aluminum alloy has a very thin film of native aluminum oxide on its surface, due to exposure of the aluminum surface to air. It is advantageous to apply the plasma sprayed coating over the bare aluminum alloy surface, or the surface exhibiting only a native oxide, as a better bond between the protective coating comprising an oxide or fluoride of Y, Sc, La, Ce, Eu, Dy, or the like, or YAG is achieved. However, the plasma-sprayed coating may also be applied over a ceramic surface such as an aluminum oxide film which is intentionally created upon the aluminum alloy surface. Typically, the thickness of such an aluminum oxide film is less than about 4 mils.

When the coated component is to be used in a plasma processing chamber where it will be exposed to chlorine species, the plasma sprayed coating should be applied over such an intentionally created aluminum oxide film, in order to better protect the underlying aluminum alloy from the corrosive chlorine plasma. In this instance, the thickness of the aluminum oxide film is typically within the range of about 0.5 mil to about 4 mils, and the temperature of the aluminum oxide film must be at least about 150-200° C. at the time of application of the protective coating comprising an oxide or fluoride of Y, Sc, La, Ce, Eu, Dy, or the like, or YAG. The temperature of the aluminum oxide film at the time of application of the protective coating should not exceed the glass transition temperature of the aluminum oxide.

Typically, the aluminum alloy surface is pre-roughened prior to anodization. The aluminum alloy surface can be pre-roughened using a technique such as bead blasting or, preferably electrochemical etching, for example, and not by way of limitation. Bead blasting techniques are well-known in the art. Commonly owned, copending U.S. application Ser. No. 09/918,683 ("the '683 application"), filed Jul. 27, 2001, discloses a method of electrochemically roughening an aluminum or aluminum alloy surface. The electrochemical roughening method disclosed in the '683 application includes the steps of immersing the aluminum-comprising surface in an aqueous HCl solution having a concentration ranging from about 1 volume % to about 5 volume % (typically ranging from about 1 volume % to about 3 volume %), at a temperature ranging from about 45° C. to about 80° C. (typically ranging from about 50° C. to about 70° C.), then applying an electrical charge having a charge density ranging from about 80 amps/ft.$^2$ to about 250 amps/ft.$^2$ (typically ranging from about 120 amps/ft.$^2$ to about 250 amps/ft.$^2$), for a time period ranging from about 4 minutes to about 25 minutes (typically ranging from about 4 minutes to about 20 minutes). The HCl solution may further include a chelating agent (such as, for example, but without limitation, gluconic acid, available from VWR Scientific Products, West Chester, Pa.), at a concentration of about 0.5 volume % to about 3 volume %, to control the bath chemistry and conductivity.

FIG. 1 is a graph 100 which illustrates the relative erosion rates 102 for various materials upon exposure of the materials to a $CHF_3/CF_4$ plasma. The materials include quartz; polysilicon ("Poly-Si"); single crystal silicon; CVD-deposited silicon carbide ("CVD SiC"); anodized $Al_2O_3$, having a thickness of 3 mils; spray-coated $Al_2O_3$, having a thickness of 10 mils; bulk $Al_2O_3$; spray-coated $Y_2O_3$; and bulk $Y_2O_3$.

Table One, below, presents process chemistry and conditions which were used to perform the erosion rate tests in an Applied Materials' PRODUCER™etch chamber (available from Applied Materials, Inc., Santa Clara, Calif.).

TABLE ONE

Process Conditions for Erosion Rate Test

| Step: | ARC Open | Main Etch | Overetch |
|---|---|---|---|
| $CHF_3$ (sccm) | 200 | 125 | 75 |
| $CF_4$ (sccm) | 120 | 125 | 0 |
| $O_2$ (sccm) | 15 | 32 | 0 |
| Ar (sccm) | 0 | 0 | 200 |
| He coolant applied to substrate (feed ° C.) | 8 | 8 | 10 |
| He pressure * (Torr) | 12 | 12 | 10 |
| Chamber Pressure (mTorr) | 35 | 50 | 50 |
| Substrate Bias (W) | 300 | 1250 | 1000 |
| Cathode Temperature (° C.) | 15 | 15 | 15 |
| Wall Temperature (° C.) | 15 | 15 | 15 |
| Time (hours) | 8.7 | 8.7 | 2.6 |

* Pressure of helium beneath substrate which is allowed to "leak" around the edges of the substrate to provide a flow of cooling fluid over the surface of the substrate.

The process conditions for the erosion rate test provided in Table One were selected in order to mimic the process conditions to which semiconductor processing chamber surfaces are exposed over time during etch processing of actual semiconductor substrates (such as silicon wafers having various material layers deposited thereon). As shown in FIG. 1, after exposure to the $CHF_3/CF_4$ plasma, the average erosion rate of plasma spray-coated $Y_2O_3$ applied by the method of the invention (ave. erosion rate=243 Å/min) is not much different than the average erosion rate of bulk $Y_2O_3$ (ave. erosion rate=127 Å/min), and is significantly lower than the average erosion rates of conventional coatings such as anodized $Al_2O_3$ (ave. erosion rate=866 Å/min), spray-coated $Al_2O_3$ (ave. erosion rate=741 Å/min), and CVD deposited silicon carbide (ave. erosion rate=526 Å/min).

The applied thickness of the protective coating comprising an oxide or fluoride of Y, Sc, La, Ce, Eu, Dy, or the like, or YAG depends on the environment to which the aluminum alloy component or structure will be exposed during use. When the temperature to which the component or structure is exposed is lower, the thickness of the plasma sprayed coating can be increased without causing a coefficient of expansion problem. For example, when the component or structure may be exposed to thermal cycling between about 15° C. and about 120° C., and the protective coating is yttria (which has been plasma sprayed over an aluminum alloy from the 5000 through 7000 series having a native oxide present on its surface), the thickness of the yttria coating should range between about 12 mils and about 20 mils. A yttria coating having a thickness of about 15 mils provides excellent results. A thinner coating down to about 10 mils thickness may be used in combination with an anodized aluminum oxide coating or other aluminum oxide coating having a thickness ranging from about 0.5 mil to about 4 mils.

Application of the protective, plasma-resistant coating by plasma spraying has produced excellent results. Plasma spraying is a surface processing technology in which a powdered material is melted, using the high thermal energy of hot plasma, and is blown against the surface of a substrate material to form a film. The spray material is typically a metal, ceramic, or combination thereof. Plasma spraying has significant advantages over other types of spray application techniques. For example, films having good adhesion to substrate materials can be obtained at fast processing speeds on relatively cold (100° C.-300° C.) substrate materials at atmospheric pressure.

Figure 2:
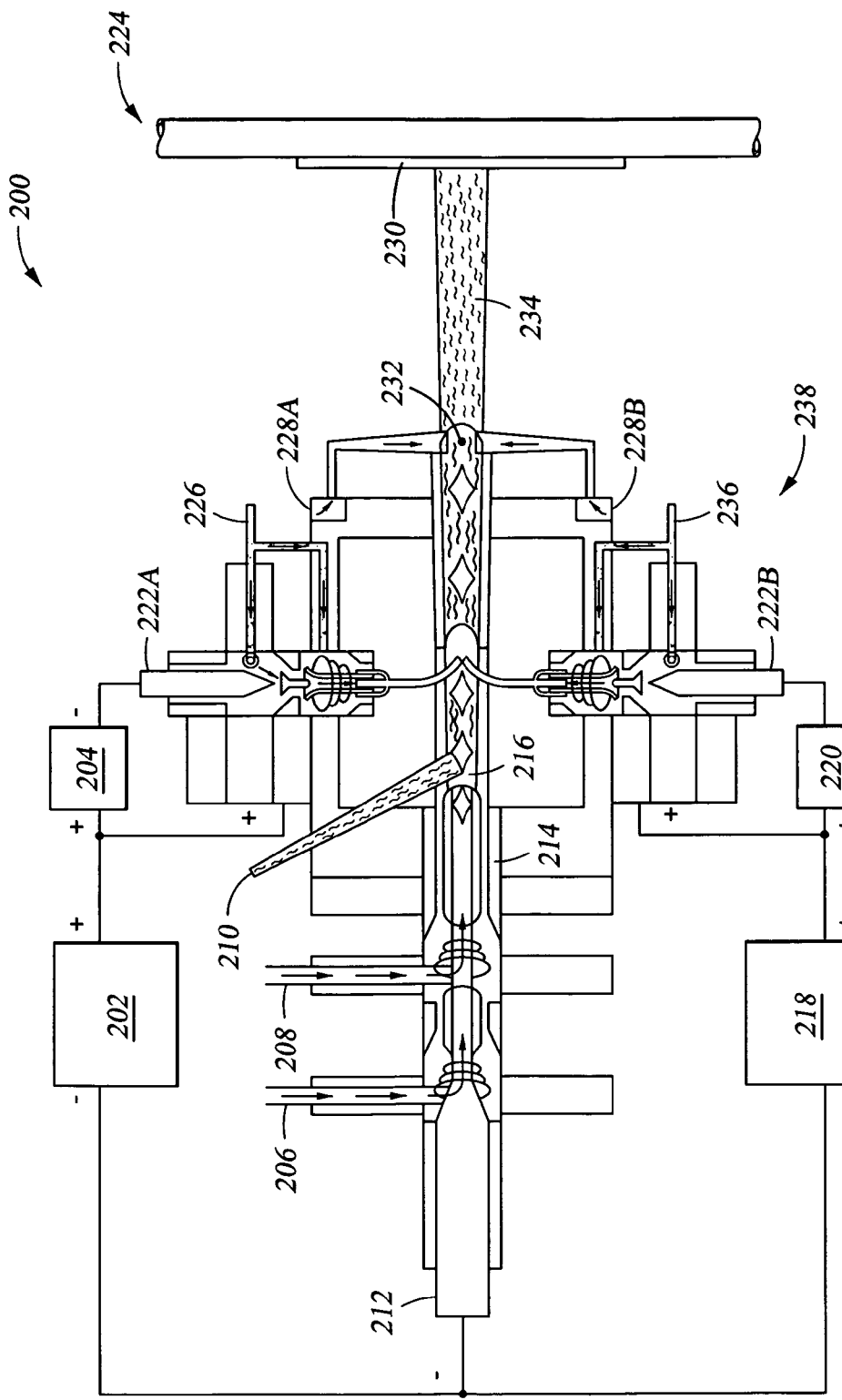
FIG. 2 is a cross-sectional schematic 200 of a type of plasma spraying system which is useful in applying the coatings of the present invention.

FIG. 2 is a cross-sectional schematic 200 of a type of plasma spraying system (a twin anode alpha torch 238) which is useful in applying the coatings of the present invention. The particular apparatus illustrated in FIG. 2 is an APS 7000 Series Aeroplasma Spraying System available from Aeroplasma K.K. (Tokyo, Japan). The apparatus 200 includes the following components: first DC main electrode 202; first auxiliary electrode 204; first argon source 206; first air source 208; spray material powder source 210; cathode torch 212; accelerator nozzle 214; plasma arc 216; second DC main electrode 218; second auxiliary electrode 220; dual anode torches 222A and 222B; second argon source 226; second air sources (plasma trimming) 228A and 228B; third argon source 236; plasma jet 232; molten powder source 234; and a base material source 224 which is to be sprayed.

Twin anode α torch 238 consists of two anode torches, so that each of the anode torches bears half of the thermal load. Using twin anode torch α238, a high voltage can be obtained with relatively low current, so that the thermal load on each of the torches will be low. Each nozzle and electrode rod of the torches is water-cooled separately, and the arc starting point and ending point are protected by inert gas, so that stable operation at 200 hours or more is ensured, the service life of consumed parts is extended, and maintenance costs are reduced.

A high temperature arc is formed stably between the cathode torch 212 and the anode torch 222, and spray material can be fed directly into the arc. The spray material is completely melted by the high temperature arc column. The arc starting and ending points are protected by inert gas, so that air or oxygen can be used for the plasma gas introduced through the accelerator nozzle 214.

A plasma trimming function 228 is used for twin anode α. Plasma trimming trims the heat of the plasma jet that does not contribute to melting of the spray material, and reduces the thermal load on the substrate material and film to making spraying at short distances possible.

One skilled in the art will be able to adapt the method of the invention to a similar type apparatus used for thermal/plasma spray coating.

When plasma spraying is used to apply the coating, to further improve the performance of the protective, plasma-resistant coating, it is advantageous to clean the coating after application to the substrate. The cleaning process removes trace metal impurities which may cause problems during semiconductor processing, and also removes loose particles from the surface of the coating which are likely to become contaminating particulates during the processing of product adjacent to the coated surface, especially when that product is a semiconductor device.

The cleaning process should remove undesired contaminants and deposition process by-products without affecting the performance capability of the protective coating, and without harming the underlying aluminum alloy surface. To protect the aluminum alloy surface while the coating is cleaned, the coating is first saturated with an inert solvent which does not harm the aluminum alloy upon contact. Subsequently, a chemically active solvent is applied to remove contaminants from the protective coating.

In the coating cleaning process, a coated substrate (such as a semiconductor processing system component) is immersed in a deionized water ultrasonic bath ("first DI bath") at a frequency of about 40 kHz (for example, and not by way of limitation) for a period of about 5 minutes to about 30 minutes. This presaturates the coating with water and removes loose particles from the coating surface prior to chemical cleaning. The coated component is then chemically cleaned to remove trace metals by wiping the component surface with a soft wipe which has been wetted with a dilute acid solution for a period of about 3 minutes to about 15 minutes. One advantageous dilute acid solution comprises about 0.1 to about 5 volume % HF (more typically, about 1 to about 5 volume %); about 1 to about 15 volume % $HNO_3$ (more typically, about 5 to about 15 volume %); and about 80 to about 99 volume % deionized water. The dilute acid solution should not contact an anodized area of the aluminum alloy surface.

After wiping the component with the dilute acid solution, as described above, the component is then rinsed with deionized water, followed by immersion in a deionized water ultrasonic bath ("second DI bath") at a frequency of about 40 kHz (for example, and not by way of limitation) for a period of about 30 minutes to about 2 hours (typically, for about 40 minutes to about 1 hour). Following removal from the second DI bath, the component is rinsed with deionized water again, then blow dried with $N_2$ and lamp/oven baked at a temperature of about 50° C. to about 70° C. for a period of up to 2 hours. The component is typically further cleaned using $CO_2$ snow (very fine dry ice), which causes any remaining particles to freeze, crumble, and detach from the component surface.

Table Two, below, presents the results of an analysis of the number of 0.2 µm diameter or larger particles per square centimeter remaining on a coated substrate surface after cleaning according to the multiple step cleaning process described above, with second DI bath times of 10, 40, and 70 minutes.

TABLE TWO

Particles Remaining on Coated Substrate Surface After Cleaning

| Cleaning Time (minutes) | Number of ≧0.2 μm particles/cm² |
|---|---|
| 10 | 760,000 |
| 40 | 240,000 |
| 70 | 230,000 |

After 40 minutes of immersion in the second DI bath, the number of particles present on the substrate surface has been reduced to approximately one-third of the number of particles remaining after 10 minutes immersion in the second DI bath.

Table Three, below, presents the results of an analysis of the surface concentration ($\times 10^{10}$ atoms/cm²) of mobile elements on a coated substrate surface after a standard cleaning process and after cleaning according to the multiple step cleaning process described above. The standard cleaning process is a single-step process in which a coated substrate is immersed in a deionized water ultrasonic bath at a frequency of about 40 kHz for a period of up to 1 hour (typically, about 40-50 minutes).

TABLE THREE

Surface Concentration of Mobile Elements on Coated Substrate After Standard and Preferred Cleaning Processes

| | Surface Concentration ($\times 10^{10}$ atoms/cm²) | |
|---|---|---|
| Element | After Standard Cleaning | After Preferred Cleaning |
| Chromium (Cr) | <20 | <20 |
| Copper (Cu) | 350 | 600 |
| Iron (Fe) | <20 | 130 |
| Magnesium (Mg) | 140,000 | 17,000 |
| Manganese (Mn) | 120 | 48 |
| Titanium (Ti) | <20 | <20 |
| Zinc (Zn) | 2400 | 120 |

The surface concentrations of mobile elements magnesium, manganese, and zinc have been greatly reduced after cleaning using the preferred process in comparison with the "standard" cleaning process. This reduces the possibility that these mobile elements will travel to a workpiece surface during processing in an apparatus protected by the coating.

In addition to removing impurities and contaminants from the coating surface, the step of wiping the coated component with the dilute HF solution provides fluorination to the coating surface. Fluorination of the coating surface results in a robust, stable coating which is inert to reactive plasmas. Fluorination of the coating surface can also be obtained by exposing the coated surface to a plasma containing fluorine species, such as a $CF_4$ or $CF_4/CHF_3$ having a plasma density within the range of about $1 \times 10^9$ e⁻/cm³ to about $1 \times 10^9$ e⁻/cm³, under conditions which provide a coating surface which is at least partially fluorinated.

Figure 3C:
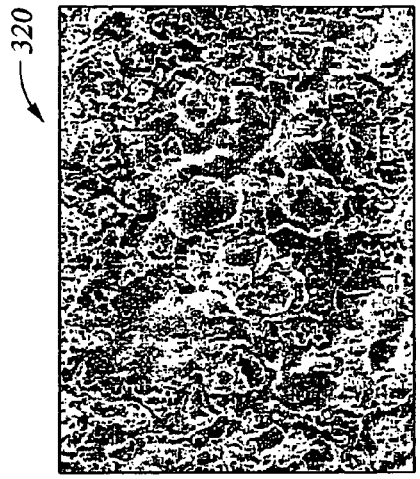
FIGS. 3A-3C show schematics of photomicrograph views (300, 310, 320) of the upper surface of a $Y_2O_3$ spray coated 6061 aluminum substrate, where the spray coating was applied to a thickness of about 200 μm on the substrate surface, which was preheated to a temperature of about 150-200° C. prior to application of the coating. The view is looking directly down at the substrate, at magnifications of 100×, 500×, and 1000× (FIGS. 3A, 3B, and 3C, respectively).
Figure 3F:
FIGS. 3D-3F show schematics of photomicrograph views (330, 340, 350) of the upper surface of the same $Y_2O_3$ spray coated 6061 aluminum substrate shown in FIGS. 3A-3C. The view of the sample surface was tilted during image generation to show the topography in more detail, at magnifications of 200×, 750×, and 1500×(FIGS. 3D, 3E, and 3F, respectively).
Figure 3B:
Figure 3E:
Figure 3A:
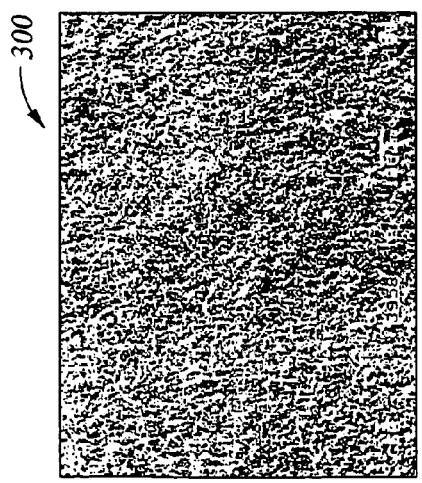

FIGS. 3A-3C show schematics of photomicrograph views (300, 310, 320) of the upper surface of a $Y_2O_3$ spray coated 6061 aluminum substrate, where the spray coating was applied to a thickness of about 200 μm on the substrate surface, which was preheated to a temperature of about 150-200° C. prior to application of the coating. The view is looking directly down at the substrate, at magnifications of 100×, 500×, and 1000× (FIGS. 3A, 3B, and 3C, respectively).

Figure 3D:
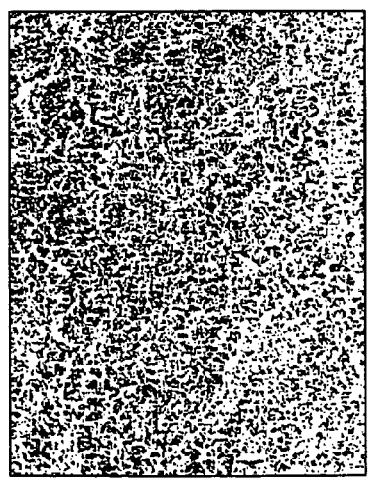

FIGS. 3D-3F show schematics of photomicrograph views (330, 340, 350) of the upper surface of the same $Y_2O_3$ spray coated 6061 aluminum substrate shown in FIGS. 3A-3C. The view of the sample surface was tilted during image generation to show the topography in more detail, at magnifications of 200×, 750×, and 1500× (FIGS. 3D, 3E, and 3F, respectively).

The photomicrographs shown in FIGS. 3A-3F show, in detail, the microstructure of the $Y_2O_3$ coating on the aluminum substrate. The roughness of the surface is desirable in that it allows polymer and other byproducts of semiconductor manufacturing processes to collect on semiconductor processing apparatus surfaces, thereby extending the mean time required between apparatus cleanings.

Figure 4B:
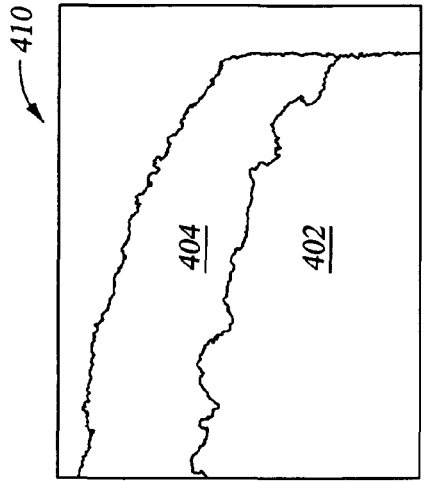
FIGS. 4A-4D show schematics of photomicrograph views (400, 410, 420, 430) of a cross-section of a 6061aluminum substrate 402 which has been spray coated with a layer 404 of $Y_2O_3$, where the spray coating was applied to a thickness of about 200 μm on the substrate surface, which was preheated to a temperature of about 150-200° C. prior to application of the coating.
Figure 4D:
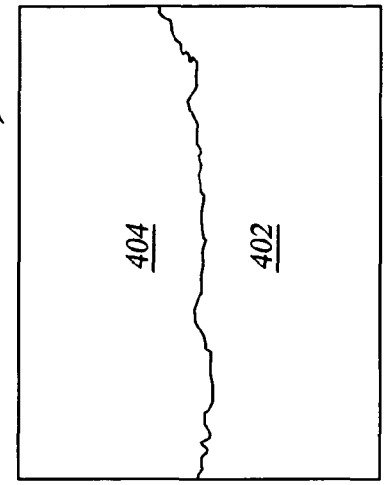
Figure 4A:
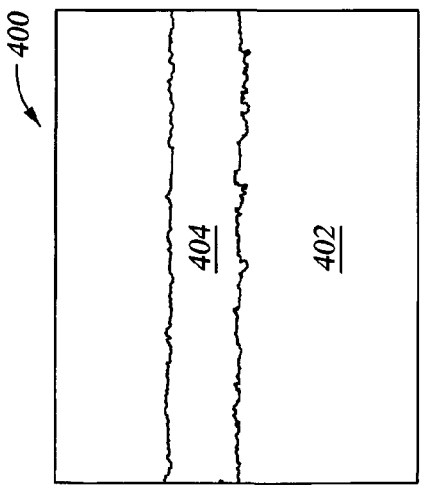
Figure 4C:
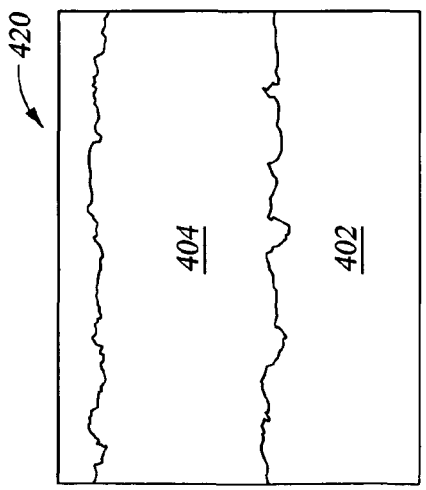

FIGS. 4A-4D show schematics of photomicrograph views (400, 410, 420, 430) of a cross-section of a 6061 aluminum substrate 402 which has been spray coated with a layer 404 of $Y_2O_3$, where the spray coating was applied to a thickness of about 200 μm on the substrate surface, which was preheated to a temperature of about 150-200° C. prior to application of the coating. FIGS. 4A-4C show the cross-section of the spray-coated substrate at magnifications of 100×, 200×, and 250×, respectively. FIG. 4D shows the interface between the $Y_2O_3$ coating 404 and the underlying aluminum 402 in detail (2000× magnification).

The photomicrographs shown in FIGS. 4A-4D illustrate the very dense compression microstructure of the $Y_2O_3$ coating 404, as well as the superior interface between the $Y_2O_3$ coating 404 and the underlying aluminum substrate 402.

Figure 5A:
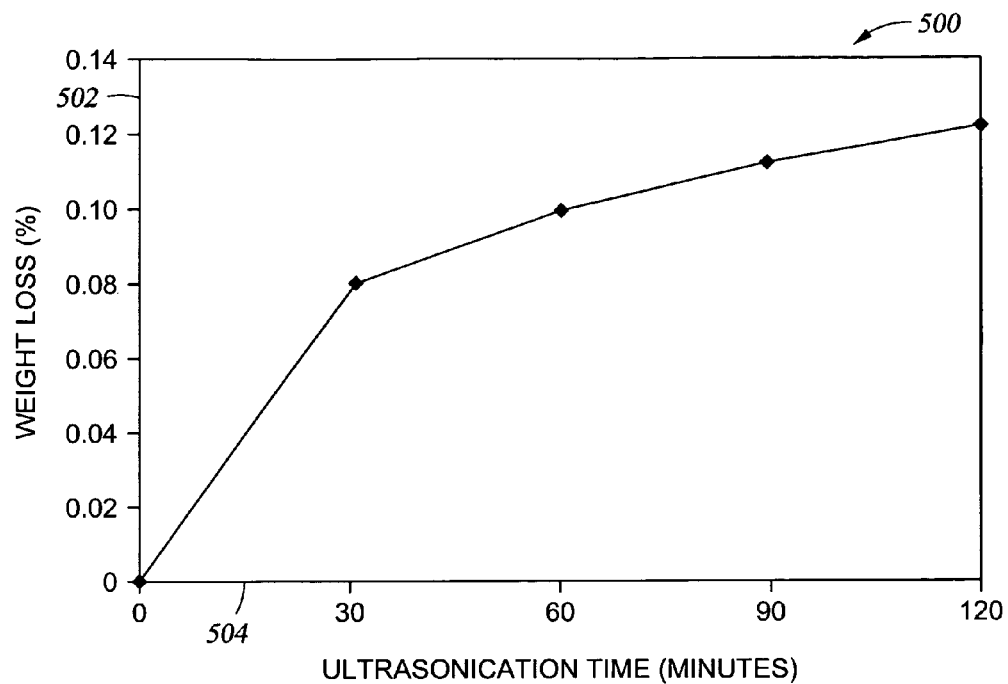
FIG. 5A is a graph 500 illustrating the weight loss of a $Y_2O_3$ spray coated 6061 aluminum test coupon (where the spray coating was applied to a thickness of about 200 μm on the substrate surface, and where the substrate surface was not preheated prior to application of the coating), after an ultrasonification treatment was carried out on the test coupon. The graph shows the weight loss 502 of the coupon as a function of the time 504 of the ultrasonification treatment.

FIG. 5A is a graph 500 illustrating the weight loss of a $Y_2O_3$ spray coated 6061 aluminum test coupon (where the spray coating was applied to a thickness of about 200 μm on the substrate surface, where the substrate surface was not preheated prior to application of the coating), after an ultrasonification treatment was carried out on the test coupon. The $Y_2O_3$ coating was not cleaned after application and prior to the ultrasonification. The graph shows the weight loss 502 of the coupon as a function of the time 504 of the ultrasonification treatment. The weight loss 502 of the coupon increased to about 0.08% within 30 minutes of the start of ultrasonification, then continued to increase up to about 0.12% after 120 minutes of ultrasonification.

Figure 5B:
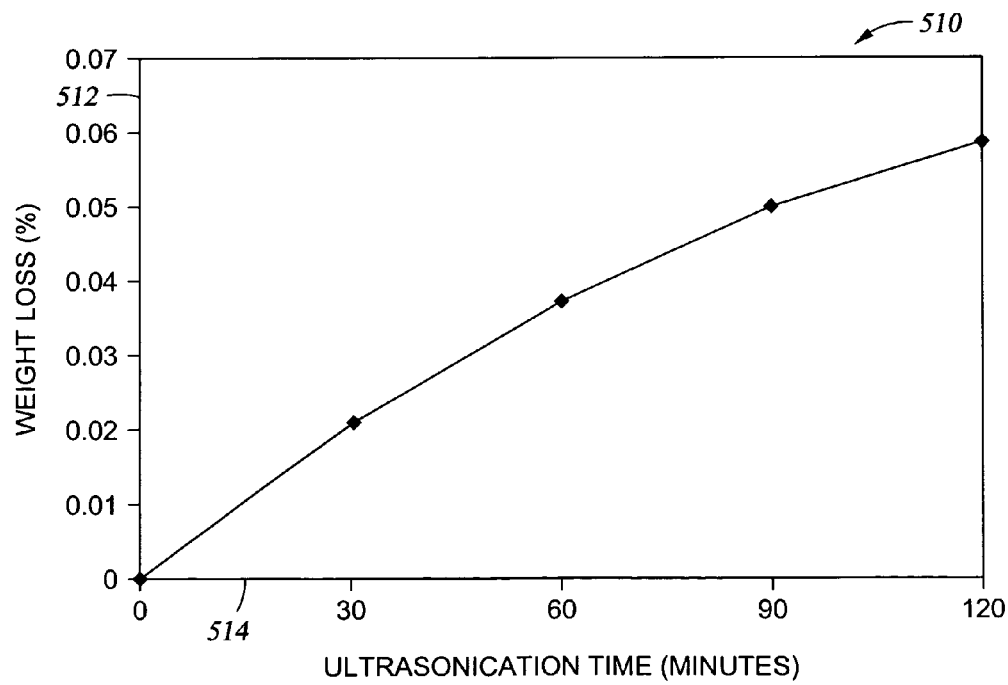
FIG. 5B is a graph 510 illustrating the weight loss of a $Y_2O_3$ spray coated 6061 aluminum test coupon (where the spray coating was applied to a thickness of about 200 μm on the substrate surface, and where the substrate surface was preheated to a temperature of about 150-200° C. prior to application of the coating), after an ultrasonification treatment was carried out on the test coupon. The graph shows the weight loss 512 of the coupon as a function of the time 514 of the ultrasonification treatment.

FIG. 5B is a graph 510 illustrating the weight loss of a $Y_2O_3$ spray coated 6061 aluminum test coupon (where the spray coating was applied to a thickness of about 200 μm on the substrate surface, where the substrate surface was preheated to a temperature of about 150-200° C. prior to application of the coating), after an ultrasonification treatment was carried out on the test coupon. The $Y_2O_3$ coating was not cleaned after application and prior to the ultrasonification. The graph shows the weight loss 512 of the coupon as a function of the time 514 of the ultrasonification treatment. The weight loss 512 of the coupon increased steadily to about 0.06% after 120 minutes of ultrasonification. The total weight loss (0.06%) of the coupon with substrate preheating was about half of the coupon weight loss (0.12%) without substrate preheating (shown in FIG. 5A).

We have also discovered that application of a protective coating comprising an oxide or fluoride of Y, Sc, La, Ce, Eu, Dy, or the like, or YAG, which is under compression in accordance with the present invention, permits the drilling of patterns such as attachment openings through the protective coating and underlying aluminum alloy substrate, with less harm to both the protective coating and the interface between the protective coating and the underlying substrate. Laser drilling may be used to form round through-holes. Ultrasonic drilling provides excellent results when drilling through-holes of more complicated shapes (such as crescent shapes). The ultrasonic drilling can be carried out either from the coating surface side or the aluminum alloy substrate side of the component or substrate. The coated substrate may be cleaned after ultrasonic drilling according to the multiple step cleaning process described above.

When ultrasonic drilling from a surface of a component or substrate, the best results are achieved when a thin sacrificial layer of a flexible polymeric material is applied or when a more rigid material having a similar thermal coefficient of linear expansion to that of the protective coating is applied over the protective coating surface. The sacrificial layer is typically applied to have a thickness within the range of about 4 mils to about 6 mils.

Figure 6A:
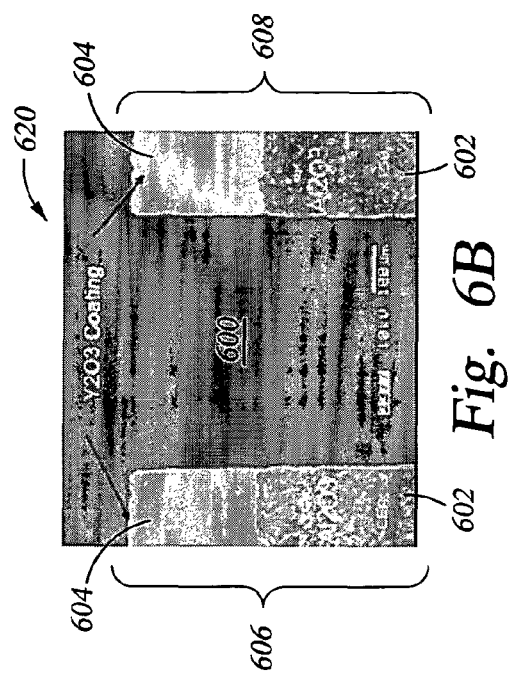
FIGS. 6A-6D show schematic illustrations (610, 620, 630, 640) of photomicrograph cross-sectional views of a hole 600 which has been ultrasonically drilled from the coating side of an aluminum test coupon 602 which has been spray coated with a layer 604 of $Y_2O_3$, where the spray coating was applied to a thickness of about 250 μm, and where the aluminum substrate 602 was preheated to a temperature of 150-200° C. at the time the coating 604 was applied.
Figure 6B:
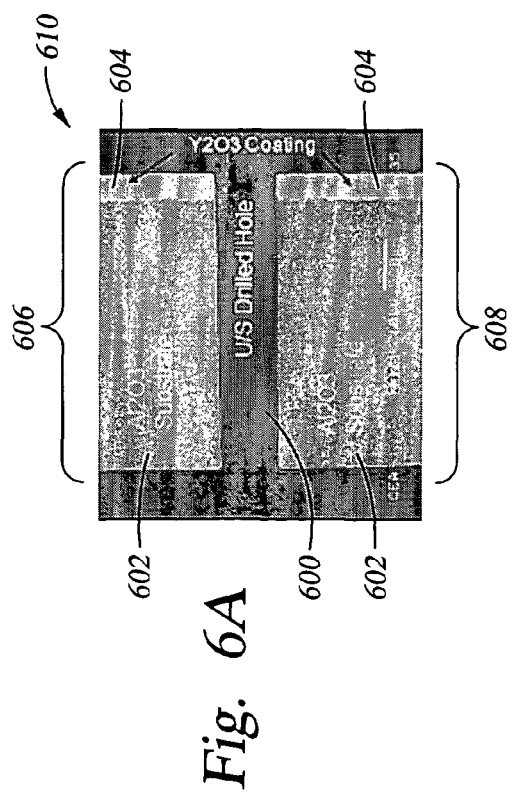
Figure 6D:
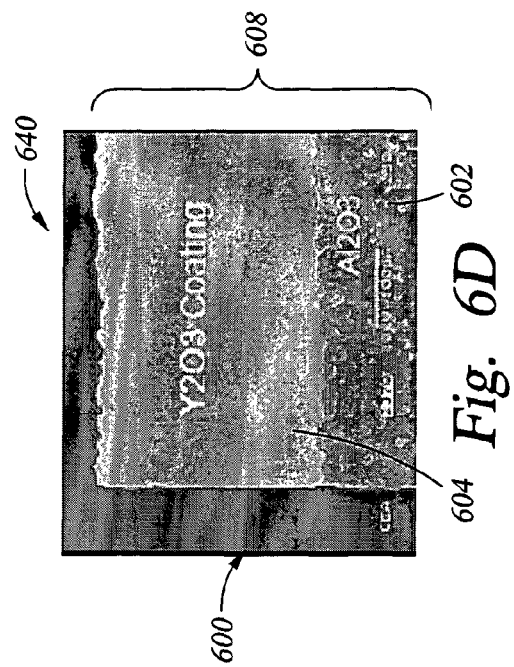
Figure 6C:
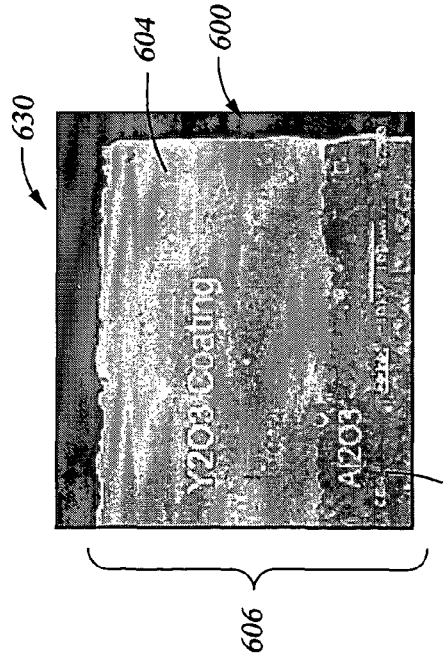

FIGS. 6A-6D show schematic illustrations (610, 620, 630, 640) of photomicrograph cross-sectional views of a hole 600 which has been ultrasonically drilled from the coating side of an aluminum test coupon 602 which has been spray coated with a layer 604 of $Y_2O_3$, where the spray coating was applied to a thickness of about 250 μm, and where the aluminum substrate 602 was preheated to a temperature of 150-200° C. at the time the coating 604 was applied. The coated aluminum test coupon 602 was cleaned according to the multiple step cleaning process described above after ultrasonic drilling. FIGS. 6A and 6B show cross-sectional views of the hole 600 at magnifications of 35× and 150×. FIGS. 6C and 6D show cross-sectional views of the left side 606 and right side 608 of hole 600, at a magnification of 250×. The edges of the hole 600 showed no evidence of breaking or chipping, and no delamination of the coating from the aluminum surface was observed.

Figure 7A:
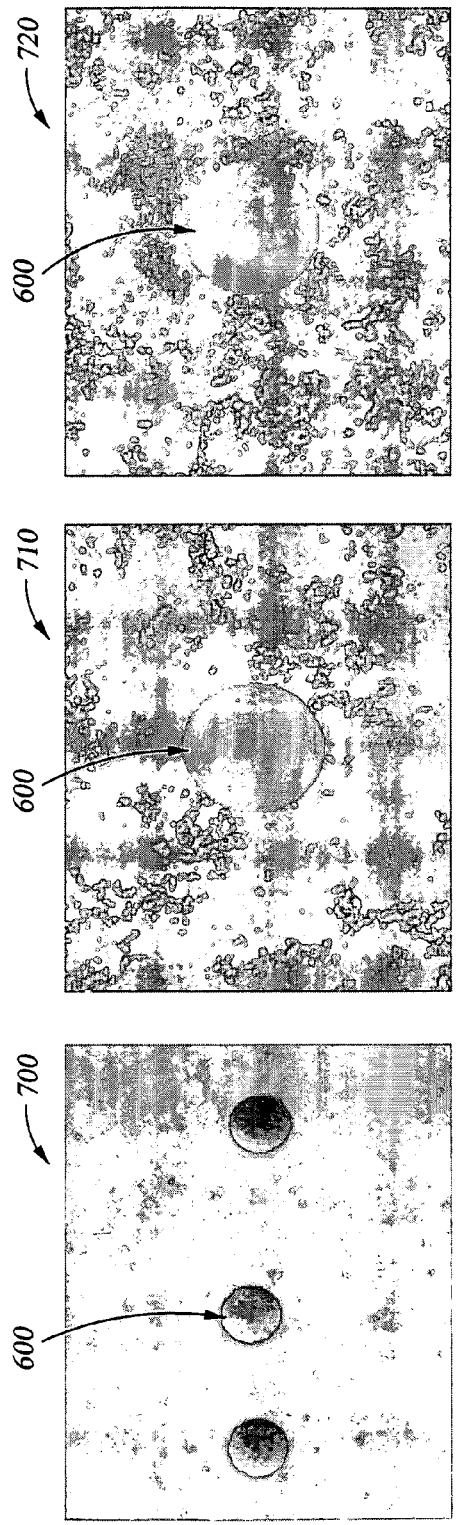
Figure 7A:
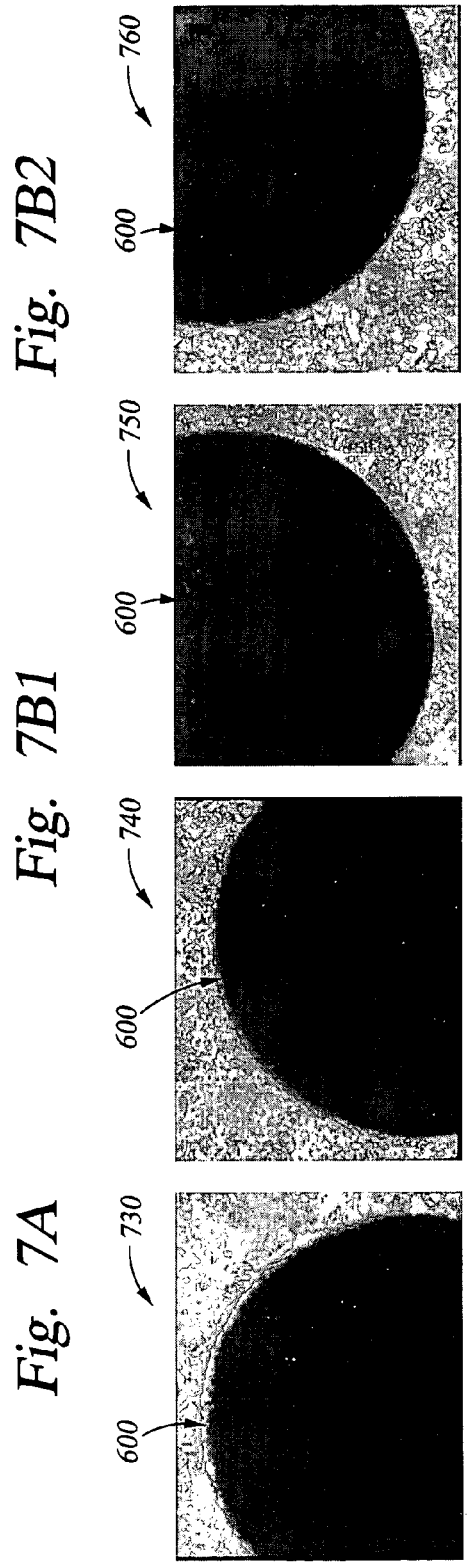

FIGS. 7A-7C show schematic illustrations (700, 710, 720, 730, 740, 750, 760) of various photomicrograph top views of the hole 600 shown in FIGS. 6A-6D, at magnifications of 25× (FIG. 7A), 50× (FIGS. 7B(1 & 2)), and 150× (FIGS. 7C(1-4)). The bright areas observed in the photomicrographs are optical depth-of-field effects which represent high spots on the coating surface. Again, the edges of the hole 600 showed no evidence of breaking or chipping.

Figure 8A:
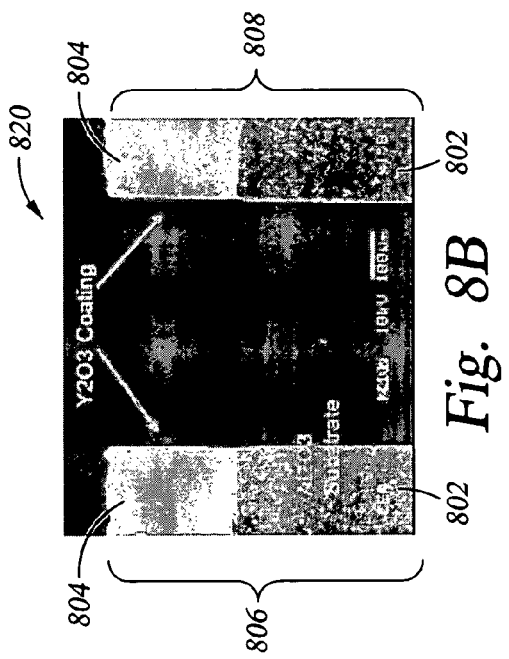
FIGS. 8A-8D show schematic illustrations (810, 820, 830, 840) of photomicrograph cross-sectional views of a hole 800 which has been ultrasonically drilled from the substrate side of an aluminum test coupon 802 which has been spray coated with a layer 804 of $Y_2O_3$, where the spray coating was applied to a thickness of about 250 μm, and where the aluminum substrate 802 was preheated to a temperature of 150-200° C. at the time the coating 804 was applied.
Figure 8B:
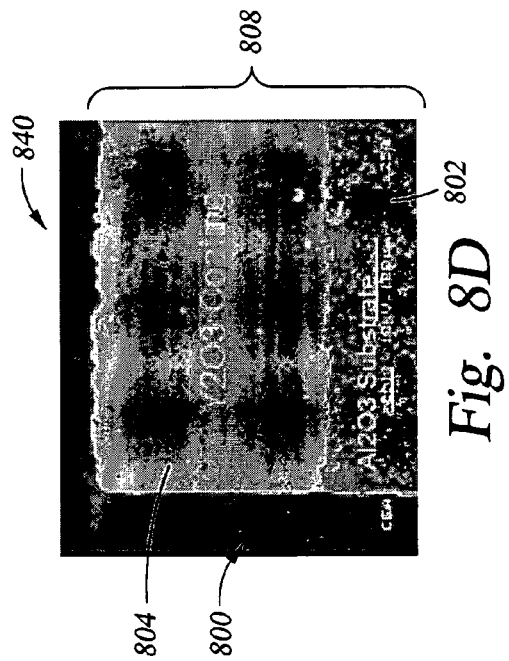
Figure 8C:
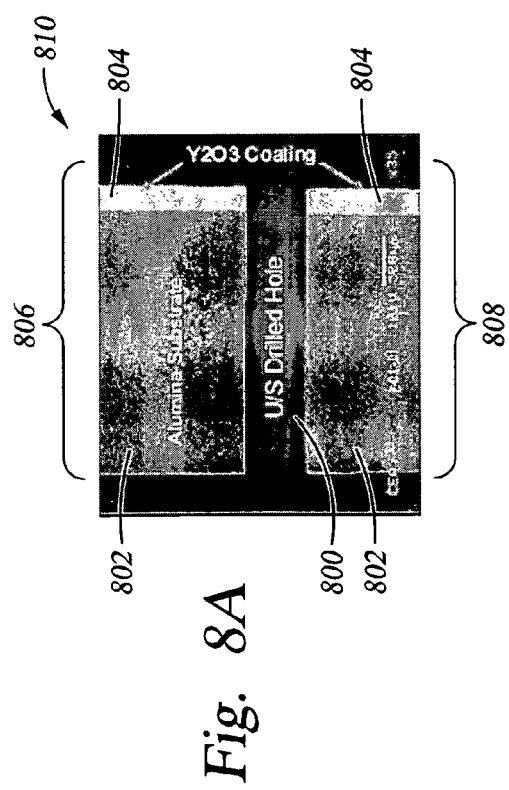
Figure 8D:
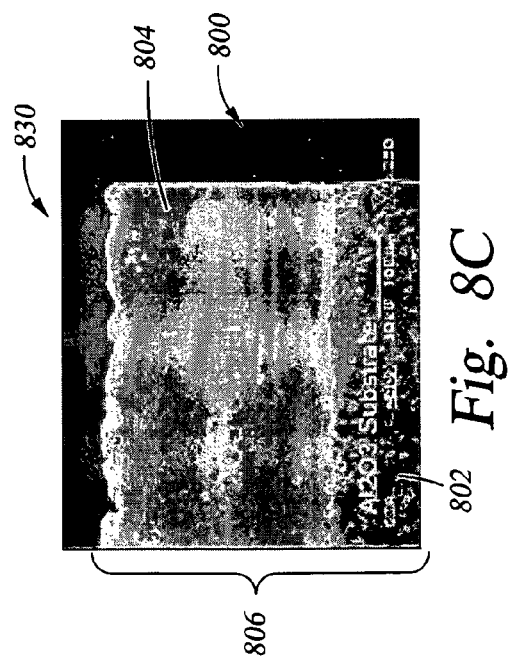

FIGS. 8A-8D show schematic illustrations (810, 820, 830, 840) of photomicrograph cross-sectional views of a hole 800 which has been ultrasonically drilled from the substrate side of an aluminum test coupon 802 which has been spray coated with a layer 804 of $Y_2O_3$, where the spray coating was applied to a thickness of about 250 μm, and where the aluminum substrate 802 was preheated to a temperature of 150-200° C. at the time the coating 804 was applied. The coated aluminum test coupon 702 was cleaned according to the multiple step cleaning process described above after ultrasonic drilling. FIGS. 8A and 8B show cross-sectional views of the hole 700 at magnifications of 35× and 150× . FIGS. 8C and 8D show cross-sectional views of the left side 806 and right side 808 of hole 800, at a magnification of 250×. The edges of the hole 800 showed no evidence of breaking or chipping, and no delamination of the coating from the aluminum surface was observed.

Figure 9A:
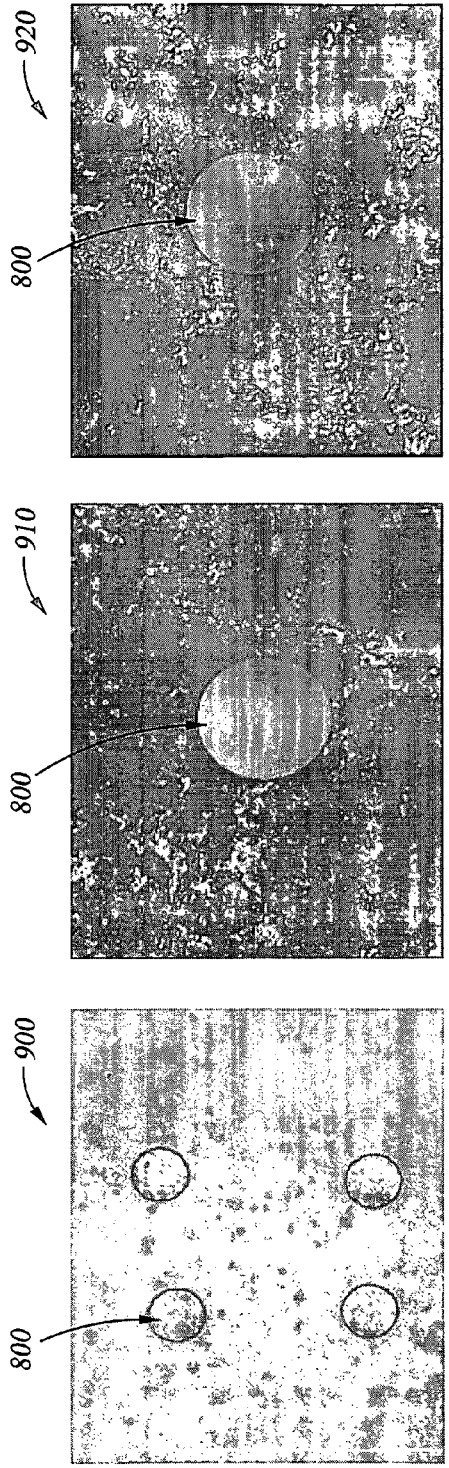
Figure 9A:
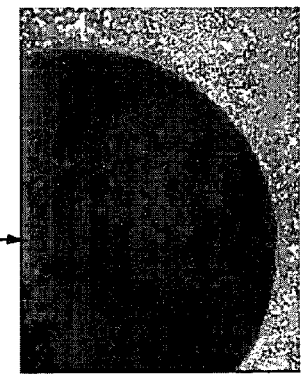
Figure 9A:
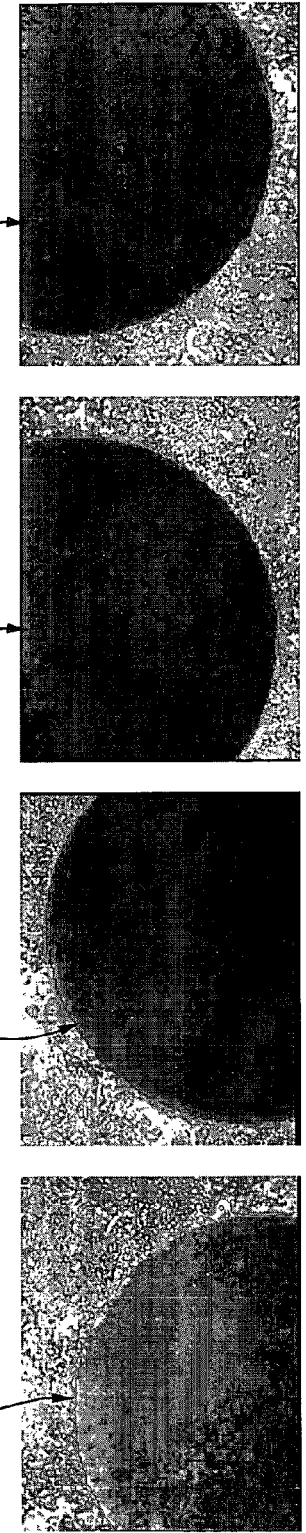

FIGS. 9A-9C show schematic illustrations (900, 910, 920, 930, 940, 950, 960) of various photomicrograph top views of the hole 800 shown in FIGS. 8A-8D, at magnifications of 25× (FIG. 9A), 50× (FIGS. 9B(1 & 2)), and 150× (FIGS. 9C(1-4)). Again, the edges of the hole 800 showed no evidence of breaking or chipping The above described exemplary embodiments are not intended to limit the scope of the present invention, as one skilled in the art can, in view of the present disclosure expand such embodiments to correspond with the subject matter of the invention claimed below.

We claim:

1. A method of providing a plasma-resistant coating on an aluminum or aluminum alloy substrate, where the substrate is a surface of a plasma processing apparatus, wherein said method comprises applying a coating over at least a portion of a surface of said substrate, wherein said coating includes an oxide of an element selected from the group consisting of Y, Sc, La, Ce, Eu, Dy, and combinations thereof, wherein said coating, which is an oxide of an element selected from said group, is applied to said substrate surface using a technique selected from the group consisting of thermal/flame spraying, plasma spraying, and chemical vapor deposition (CVD), and wherein said substrate surface is preheated to a depth of at least 250 mils to a temperature of at least 150° C., and prior to application of said coating over said preheated substrate surface, followed by cooling of said coated substrate to place an exterior surface of said coating in compression, so that a porosity of said coating at said coating exterior surface is less than 1.5%, followed by reaction of said exterior surface of said coating with a dilute acid solution comprising about 0.1 volume % to about 5 volume % HF, about 1 volume % to about 15 volume % $HNO_3$, and about 80 volume % to about 99 volume % deionized water, to create a fluoride of an element selected from said group upon said exterior surface of said coating, and wherein said exterior surface of said coating provides an average erosion rate of said coating when exposed to a fluorine-comprising plasma of about 243 Å/min or less. [The claim has been amended to clarify that the limitation "substrate" pertains to a surface of a plasma processing apparatus, and not to a substrate (work piece) being processed].

2. A method in accordance with claim 1, wherein said fluoride of an element is yttrium fluoride.

3. A method in accordance with claim 2, wherein said coating thickness prior to said treatment with said dilute acid solution is within the range of about 12 mils to about 20 mils.

4. A method in accordance with claim 1, wherein said substrate comprises an aluminum alloy of the 2000 series or the 5000 through 7000 series.

5. A method in accordance with claim 4, wherein said substrate comprises an aluminum alloy of the 5000 through 7000 series.

6. A method in accordance with claim 1, wherein said coating is applied by plasma spraying.

7. A method in accordance with claim 1, including an additional step in which an aluminum oxide coating is applied over said aluminum or aluminum alloy substrate prior to application of said oxide coating.

8. A method in accordance with claim 7, wherein said aluminum oxide coating over said aluminum or aluminum alloy substrate is heated to a temperature of at least 150° C. and wherein a depth of heating from an upper surface of said oxide coating and into said substrate is at least 250 mils prior to deposition of said oxide coating.

9. A method in accordance with claim 8, wherein said fluoride of an element is yttrium fluoride.

\* \* \* \* \*